United States Patent
Jeng et al.

(10) Patent No.: US 7,374,861 B2
(45) Date of Patent: May 20, 2008

(54) NEGATIVE PHOTORESIST COMPOSITION

(75) Inventors: Jyh-Long Jeng, Hsinchu (TW);
Jeng-Yu Tsai, Hsinchu (TW);
Charng-Shing Lu, Hsinchu (TW);
Jinn-Shing King, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 302 days.

(21) Appl. No.: 11/365,489

(22) Filed: Mar. 2, 2006

(65) Prior Publication Data

US 2007/0141509 A1   Jun. 21, 2007

(51) Int. Cl.
*G03F 7/037* (2006.01)
*G03F 7/027* (2006.01)
(52) U.S. Cl. .............................. 430/283.1; 430/287.1; 430/916; 430/947; 430/920
(58) Field of Classification Search .............. 430/283.1
See application file for complete search history.

(56) References Cited

U.S. PATENT DOCUMENTS

| | | | | |
|---|---|---|---|---|
| 4,321,319 | A | * | 3/1982 | Shoji et al. ............... 430/270.1 |
| 4,558,117 | A | * | 12/1985 | Nakano et al. ............. 528/184 |
| 4,741,988 | A | * | 5/1988 | Van der Zande et al. ... 430/312 |
| 5,472,823 | A | * | 12/1995 | Hagiwara et al. ........ 430/270.1 |
| 6,010,832 | A | * | 1/2000 | Gelorme et al. ............ 430/325 |
| 6,025,113 | A | * | 2/2000 | Kikkawa et al. ......... 430/283.1 |
| 6,090,525 | A | * | 7/2000 | Yuba et al. ............. 430/283.1 |
| 2002/0045127 | A1 | * | 4/2002 | Chiang et al. ........... 430/281.1 |

* cited by examiner

*Primary Examiner*—Cynthia Hamilton
(74) *Attorney, Agent, or Firm*—Bacon & Thomas PLLC.

(57) ABSTRACT

The present invention is directed to a negative photoresist composition which mainly is composed of a) a polyimide having pendant carboxyl groups, wherein a portion of the carboxyl groups reacted with glycidyl (meth)acrylate monomers to form covalent bonds. The photoresist composition further contains b) monomers having a tertiary amino group and a C═C double bond, which form ionic bonds with the remaining hydroxyl groups of the polyimide. The photoresist composition further contains c) a photoinitiator which is also called photosensitizer. The components a) to c) are all dissolved in a solvent.

10 Claims, No Drawings ic acid and polyamide ester, both of which are its precursors and require a curing temperature as high as 350° C. to form polyimide after the lithography process. Such temperature gives rise to the problem of oxidation of copper circuits; and also the problem of excessive shrinkage to polyimide. Moreover, the thickness of encapsulation film produced this way is mostly less than 10 µm, which cannot satisfy the requirement of a thicker film of 20 µm or more.

NEGATIVE PHOTORESIST COMPOSITION

FIELD OF THE INVENTION

The invention relates to a negative photoresist composition, and more particularly to a negative photoresist composition that contains polyimide.

BACKGROUND OF THE INVENTION

As the trend in product development becomes more miniaturized, the use of flexible substrates with high density also flourishes. To fulfill the demand of high density and fine pitch, the material used as the encapsulation film in flexible substrate has to possess better heat endurance capability, dimensional stability, electrical properties, and chemical resistance. The drilling techniques employed during processing of traditional flexible substrates, such as pre-punching or pre-drilling, can only achieve a minimal opening diameter of 800 µm, and other techniques like screen printing drilling can only achieve a minimum of 300 µm. On the other hand, though laser drilling can achieve a minimal opening diameter of 25 µm, its high production cost renders it uncompetitive. To solve this problem, the photosensitive encapsulation film materials are adopted, and by utilizing the lithography process, fine and precise patterns can be obtained. However, the photosensitive materials are mostly composed of epoxy resin and acrylic resin, both of which do not possess sufficient heat endurance capability and mechanical strength as a encapsulation film for applications in advanced products. Moreover, in regard to fulfilling the demand of halogen-free and phosphorus-free from the perspective of environmental protection, the UL-94V0 flame retardancy requirement to the epoxy resin and acrylic resin is a major obstacle. The photosensitive polyimide (PSPI) material has excellent heat stability and good mechanical, electrical, and chemical properties. PSPI can meet UL-94V0 flame retardancy requirement without the addition of flame retardants, and it does not need to be concerned with the issue of halogen-free and phosphorus-free, which makes PSPI an ideal material for use in the advanced flexible substrates with high density and fine pitch.

Traditional PSPI is usually consisted of polyamic acid and polyamide ester, both of which are its precursors and require a curing temperature as high as 350° C. to form polyimide after the lithography process. Such temperature gives rise to the problem of oxidation of copper circuits; and also the problem of excessive shrinkage to polyimide. Moreover, the thickness of encapsulation film produced this way is mostly less than 10 µm, which cannot satisfy the requirement of a thicker film of 20 µm or more.

Soluble PSPI materials are used as the encapsulation film for advanced flexible substrates, as can be shown in US2003/0176528, US2004/0247908, US2004/0265731, and US2004/0235992. Although they can be cured at a lower temperature of 230° C., the high percentage of photosensitizing particles (acrylic acid ester) contained therein also leads to the problem of worse flame retardancy. This problem necessitates the addition of flame retardants that contain phosphorus or halogen, which cannot meet the demand of halogen-free and phosphorus-free in the future.

Although soluble PSPI materials have a lower post-curing temperature, their solvent resistance are generally worse and require alkaline developing solution at high concentration to develop images, which reduces their applicability. In Reactive & Functional Polymers; 2003, 56, 59-73, JP2002341535 and JP2003345007; Masao Tomoi and colleagues have proposed a soluble polyimide having carboxyl groups on its backbone, and acrylic acid (ester) monomers having a tertiary amino group to react with the carboxyl groups to give rise to ionic bonds, thereby forming a negative PSPI material. Because the strength of ionic bonding is not as strong as covalent bonding, the PSPI materials having ionic bonding is suitable in the case where a thickness of PSPI film is 10 µm or less. If a thicker PSPI film (20 µm) is required, its exposure energy can reach as high as 8000 mj/cm², which renders it unapplicable. Furthermore, the PSPI film resulted from post-curing has worse solvent resistance and alkaline resistance due to the presence of the aforementioned ionic bonding.

SUMMARY OF THE INVENTION

A primary objective of the present invention is to provide a negative photoresist composition (photosensitizing polyimide (PSPI) material) free from the drawbacks of the prior art techniques.

In accordance to the present invention, the negative photoresist composition is composed of: (a) a polyimide having pendant carboxyl groups, wherein a portion of the carboxyl groups reacted with glycidyl (meth)acrylate monomers to form covalent bonds, and the remaining portion of carboxyl groups reacted with (b) monomers having a tertiary amino group and a C=C double bond to form ionic bonds. The negative photoresist composition of the present invention further contains (c) a photoinitiator, also called a photosensitizer. The components (a) to (c) are all dissolved in a solvent.

The negative photoresist composition proposed by the present invention is mainly consisted of polyimide, thus it does not require post-curing at high temperature, which meets the demand of high density and fine pitch for encapsulation film used in advanced flexible substrate. Because glycidyl (meth)acrylate monomers are bonded to the backbone of polyimide, the negative photoresist composition of the present invention can be used to form thick films that have excellent film residual rate, whereas component (b) in the negative photoresist composition of the present invention can facilitate the completion of developing procedure with an alkaline solution after exposure.

DETAILED DESCRIPTION OF THE INVENTION

The present invention provides a negative photoresist composition (a photosensitizing polyimide material), it can be used as an encapsulation film of flexible copper clad laminate to protect the fragile copper circuits on the laminate; and it can also be used as the solder mask during assembly.

The negative photoresist composition of the present invention comprises the following components dissolved in a solvent: a) a polyimide having the following chemical structure (I); b) an unsaturated vinyl monomer that contains a tertiary amino group; and c) a photoinitiator. The amount of photoinitiator is 0.1-30% based on the weigh of the solid content of the polyimide (I), the amount of the monomer is 70-130% of the moles of the carboxyl group contained in polyimide (I), preferably 90-110%,

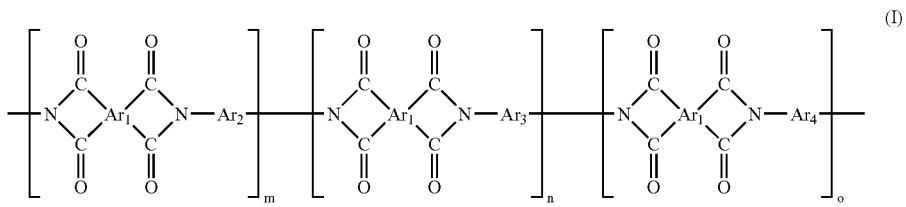

and in the chemical structure (I)
$Ar_1$ is a tetra-valent radical;
$Ar_2$ is a bivalent radical;
$Ar_3$ is a bivalent radical that contains a carboxyl group;
$Ar_4$ is a bivalent radical that contains —$CH_2$—$C(OH)H$—$CH_2$—O—C(O)—C(R)=CH;
in which R is H or a methyl group;
m+n+o=1, $0.1 \leq n+o \leq 0.6$, and n:o=9:1~4:6, preferably, n:o=3: 1~1:1.
Preferably, m=0.3~0.7.
Preferably, $Ar_3$ is

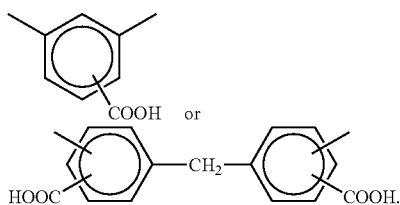

Preferably, $Ar_4$ is

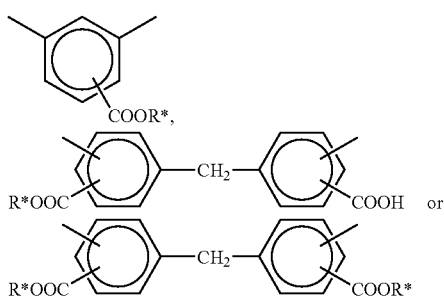

wherein R* is —$CH_2$—$C(OH)H$—$CH_2$—O—C(O)—C(R)=CH, in which R is H or a methyl group.

Preferably, the monomer is tertiary amino C1-C4 alkyl acrylate or methacrylate, or N-(tertiary amino C1-C4 alkyl) acrylamide or methacrylamide.

Preferably, $Ar_1$ is selected from

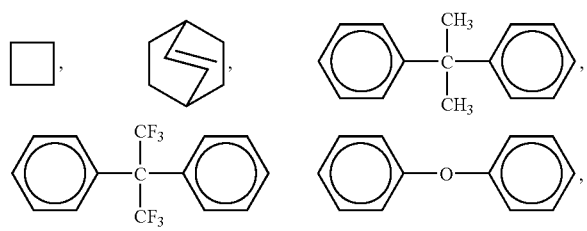

-continued

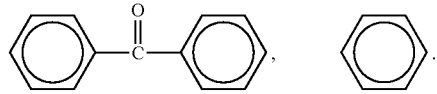

Preferably, $Ar_2$ is selected from

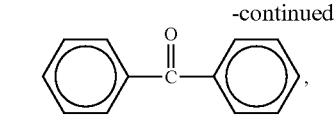

wherein i is an integer of 1-20, and $X_1$ is

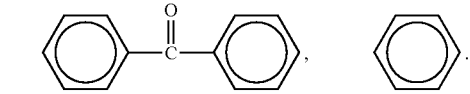

wherein i is an integer of 1-20, and Z is H or a methyl group.

A suitable process for producing the polyimide a) contained in the negative photoresist composition of the present invention comprising the following steps:

reacting dianhydride, a first diamine and a second diamine in a solvent to form a polyamic acid, wherein the first diamine contains a carboxyl group, and the dianhydride and the second diamine can be those used in the conventional process for preparing a polyimide;

adding a solvent with a high boiling point to the reaction mixture containing the polyamic acid and carrying out a chemical cyclization reaction of the polyamic acid to form a polyimide, wherein the solvent with high boiling point and the temperature of the chemical cyclization reaction can be the same used in the conventional process for preparing a polyimide via chemical cyclization reaction; and adding glycidyl (meth)acrylate to the mixture containing polyimide, and the glycidyl group reacting with a portion of the carboxyl group of the polyimide at a temperature between 60-130° C., so that a side chain of —CH$_2$—C(OH)H—CH$_2$—O—C(O)—C(R)=CH is formed on the backbone of polyimide, in which R is H or a methyl group. During the reaction, if the reaction temperature is too high, the C=C double bond will break and give rise to crosslinking, and thus an inhibitor can be added to inhibit the crosslinking, if necessary.

In the carboxyl group of the polyimide, there should be 10-60% of the COOH radical in the formation of the covalent bond —COOR* with (meth)acrylate, if more than 60% of the COOH radical are in the formation of the covalent bond —COOR*, the developing time of the negative photoresist composition of the present invention would be too long; if it is lower than 10%, the negative photoresist composition of the present invention cannot withstand the developing solution, and its photosensitivity and residual film thickness are reduced.

By adding the monomer b) having the tertiary amino group and a C=C double bond and the photoinitiator c) to the polyimide prepared according to the process described above, the preparation of the negative photoresist composition of the present invention is completed. If necessary, a solvent like N-methyl-2-pyrrolidone (NMP), N,N-dimethylacetamide (DMAc), γ-butyrolactone (GBL), xylene, and toluene can be added to adjust the viscosity of the composition so that it can be applied as a coating adequately.

Because the tertiary amino group of the monomer b) can react with COOH and form a salt bridge, this helps shorten the developing time and increase photosensitivity of the negative photoresist composition of the present invention. The monomer b) can be one of the following structures or its mixture, but is not limited thereto:

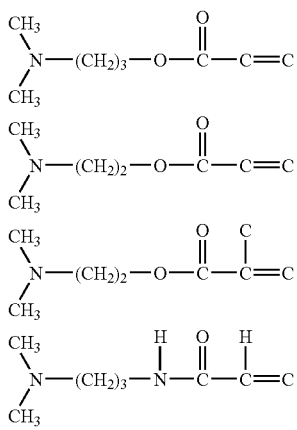

-continued

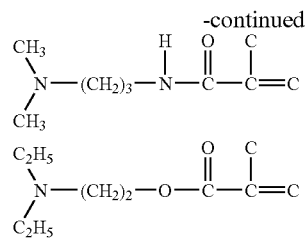

The mole ratio between the monomer b) having the tertiary amino group and C=C double bond, and the residual COOH radical on the backbone of polyimide is 1:1.

To increase the crosslinking density of the negative photoresist composition of the present invention, a multi-functional acrylate can be added including (but not limited thereto) ethyleneglycol dimethacrylate, bisphenol A EO-modified diacrylate (n=2–50) (EO is ethyleneoxide, n is the mole of the added ethyleneoxide), bisphenol F EO-modified diacrylate, trimethylolpropane triacrylate, pentaerythritol triacrylate, tris(2-hydroxy ethyl) isocyanurate triacrylate. The amount of addition cannot exceed 30% of the weight of the solid content of the polyimide, if more than 30% is added, the flame retardancy and mechanical properties of the negative photoresist composition of the present invention would be adversely affected. Preferably, the amount of addition should be more than 10%, if it is lower than 10%, the crosslinking density cannot be increased, and the ability of withstanding the developing solution is less improved.

The photoinitiator c) generates free radicals after exposure, thereby promoting the crosslinking between monomers with C=C double bonds. The preferable exposure wavelength of the photoinitiator is between 350 nm to 450 nm. Its photoefficiency decreases and results in insufficient crosslinking between monomers if the wavelength is outside this range. The photoinitiator c) of the present invention includes (but not limited thereto) the following: bis(2,4,6-trimethylbenzoyl)-phenylphosphineoxide, 2-benzyl-2-dimethylamino-1-1(4-morpholinophenyl)-butanone, 2,4,6-trimethyl benzoyl)diphenyl phosphine oxide, bis(.eta.5-2,4-cyclopentadien-1-yl)-bis(2,6-dufluoro-3-(1H-pyrrol-1-yl)-phen yl titanium, 4,4'-bis(dimethylamino)benzophenone, 4,4'-bis(diethylamino)benzophenone, N-phenyldiethanolamine. The amount of the photoinitiator c) to be added is 0.1-30% of the weight of the solid content of the polyimide, if too much is added, the heat stability of the negative composition is disrupted; if too little is added, it results in insufficient photosensitivity; thus the sufficient amount is 3-10%.

A suitable process for forming a polyimide pattern by using the negative photoresist composition of the present invention includes the steps as follows: (i) coating the negative photoresist composition onto an adequate substrate by spin coating or a like method; (ii) prebaking; (iii) exposing; (iv) development; and (v) post-curing to obtain a polyimide pattern. In the step (i), the adequate substrate can be a copper foil substrate, flexible copper clad laminate, silica substrate, glass, or ITO glass; and the like coating method can be roller coating, screen coating, curtain coating, dip coating, and spray coating, but is not limited thereto. The prebaking in step (ii) includes prebaking at 70-120° C. for several minutes to evaporate the solvents. The exposing in step (iii) includes exposing a prebaked substrate with actinic rays under a photomask, the actinic rays described above can be X-ray, electron beam ray, UV ray, visible light ray or another source of light that can supply actinic rays.

The exposed and coated substrate needs to undergo the development (iv) with an alkaline aqueous developing solution to obtain a photoresist pattern. The alkaline aqueous developing solution includes (but not limited thereto) an alkaline solution of an inorganic base (such as potassium hydroxide, and sodium hydroxide), a primary amine (such as ethylamine), a secondary amine (such as diethylamine), a tertiary amines (such as triethylamine), and a quaternary ammonium (such as tetramethylammonium hydroxide, abbreviated as TMAH), wherein the preferable developing solution should contain TMAH. The developing can be achieved by dipping, spraying, or coating or other methods. The photoresist pattern derived after developing is washed with deionized water, then subject to the post-curing (v) at 180-300° C. to remove the remaining solvents.

The present invention can be better understood through the following examples, which only serve the purpose of elucidation and are for limiting the scope of the present invention.

The formula for calculating the film residual rate is listed below:

Film residual rate (%)=[(the film thickness after post-curing)/(the film thickness after prebaking)]×100%

Chemicals:
bicyclo[2,2,2]oct-7-ene-2,3,5,6-tetracarboxylic dianhydride (B1317)
bis(3,4-dicarboxyphenyl)ether dianhydride (ODPA)
3,3',4,4'-benzophenone tetracarboxylic dianhydride (BTDA)
3,3',4,4'-biphenyl tetracarboxylic dianhydride (BPDA)
3,5-diaminobenzoic acid (DABZ)
4,4'-Oxydianiline (ODA)
4,4'-bis(3-aminophenoxy)diphenyl sulfone (m-BAPS)
2,2-bis(4-(4-aminophenoxyl)phenyl)propane (BAPP)
bisaminopropyltetramethyldisiloxane (Siloxane248)
glycidyl methacrylate (GMA)
N-methyl-2-pyrrolidone (NMP)

EXAMPLE 1

To 330 g of NMP in a 500-ml three-necked round bottom flask equipped with a mechanical stirrer and nitrogen inlet 11.41 g (75 mmol) of DABZ and 30.79 g (75 mmol) of BAPP were added and dissolved. The solution was placed into a 0° C. ice bath, followed by the addition of 24.5708 g (99 mmol) of B1317, and two hours of stirring, then the addition of 15.95 g (50 mmol) of BTDA prior to the continuation of stirring for another 4 hours; after that 70 g of xylene was added, the temperature was raised, azeotropic boiling of water and xylene occurred at 160° C. The temperature of the mixture was raised to 180° C. after xylene in the solution had completely escaped, and it was stirred for another 5 hours. A viscous and unmodified PI solution V-1 was obtained after cooling. In the next step, to 80 g of V-1 solution 1.09 g of GMA was added along with 0.08 g of hydroquinone as an inhibitor, which was then stirred at 100° C. for 12 hours to give a viscous PI solution PI-1. To the PI-1 solution 3.2 g of pentaerythritol triacrylate, 1.31 g of N-[3-(dimethylamino)propyl]methacrylamide (monomer having a tertiary amino group), and 1.6 g of photoinitiator, bis(2, 4,6-trimethylbenzoyl)-phenylphosphineoxide, were added and well mix to obtain a photosensitizing polyimide PSPI-1.

The PSPI-1 was evenly coated on an 1 OZ copper foil by a blade, prebaked for 5 minutes in a circulator oven at 120° C. to form a photosensitizing polyimide film having a thickness of about 20 μm. The copper foil coated with PSPI-1 and prebaked as described above was exposed with an unfiltered mercury arc lamp (its wavelength measured was between 250 nm and 400 nm) and a power of 1000 mJ/cm$^2$. 3 wt % TMAH ethanol solution as the developing solution was used to develop the exposed film at 35° C. with ultrasonication for a developing time of 120 seconds, followed by washing with ethanol for 30 seconds, and drying with air dryer prior to a post-curing procedure in a circulator oven at 230° C. for 30 minutes. A polyimide pattern having a thickness of 18 μm was obtained. The pattern, which has been through the developing and post-curing procedures, has a residual film thickness of 90%. The pattern has a resolution of 30 μm in line width and line-span when it was observed via an optical microscopy.

EXAMPLE 2

To 80 g of the unmodified PI solution V-1 prepared in Example 1, 0.55 g of GMA was added along with 0.08 g of hydroquinone as an inhibitor, which was then stirred at 100° C. for 12 hours to give a viscous PI solution PI-2. To the PI-2 solution 3.2 g of pentaerythritol triacrylate, 1.97 g of N-[3-(dimethylamino)propyl]methacrylamide (monomer having a tertiary amino group), and 1.6 g of photoinitiator, bis(2, 4,6-trimethylbenzoyl)-phenylphosphineoxide, were added and well mix to obtain a photosensitizing polyimide PSPI-2. The PSPI-2 was evenly coated on an 1 OZ copper foil by a blade, prebaked for 5 minutes in a circulator oven at 120° C. to form a photosensitizing polyimide film having a thickness of about 20 μm. The copper foil coated with PSPI-1 and prebaked as described above was exposed with an unfiltered mercury arc lamp (its wavelength measured was between 250 nm and 400 nm) and a power of 1000 mJ/cm$^2$. 3 wt % TMAH ethanol solution as the developing solution was used to develop the exposed film at 35° C. with ultrasonication for a developing time of 30 seconds, followed by washing with ethanol for 30 seconds, and drying with air dryer prior to a post-curing procedure in a circulator oven at 230° C. for 30 minutes. A polyimide pattern having a thickness of 17 μm was obtained. The pattern, which has been through the developing and post-curing procedures, has a residual film thickness of 85%. The pattern has a resolution of 30 μm in line width and line-span when it was observed via an optical microscopy.

EXAMPLE 3

The PSPI-1 prepared in Example 1 was evenly coated on a releasing PET film by a blade, prebaked for 4 minutes in a circulator oven at 120° C. to form a photosensitizing polyimide film having a thickness of about 20 μm. The PET film coated with PSPI-1 and prebaked as described above was laminated on an 1 OZ copper foil by a pressing machine at a temperature of 120° C. and under a pressure 50 Kgf/mm$^2$, and the PET film was stripped off to obtain a copper foil having a PSPI film, which was exposed with an unfiltered mercury arc lamp (its wavelength measured was between 250 nm and 400 nm) and a power of 1000 mJ/cm². 3 wt % TMAH ethanol solution as the developing solution was used to develop the exposed film at 35° C. with ultrasonication for a developing time of 120 seconds, followed by washing with ethanol for 30 seconds, and drying with air dryer prior to a post-curing procedure in a circulator oven at 230° C. for 30 minutes. A polyimide pattern having a thickness of 18 µm was obtained. The pattern, which has been through the developing and post-curing procedures, has a residual film thickness of 90%.

COMPARATIVE EXAMPLE 1

To 80 g of the unmodified PI solution V-1 prepared in Example 1, 2.19 g of GMA was added along with 0.08 g of hydroquinone as an inhibitor, which was then stirred at 100° C. for 12 hours to give a viscous PI solution PIC-1. To the PIC-1 solution 3.2 g of pentaerythritol triacrylate, and 1.6 g of photoinitiator, bis(2,4,6-trimethylbenzoyl)-phenylphosphineoxide, were added and well mix to obtain a photosensitizing polyimide PSPIC-1. The PSPIC-1 was evenly coated on an 1 OZ copper foil by a blade, prebaked for 5 minutes in a circulator oven at 120° C. to form a photosensitizing polyimide film having a thickness of about 20 µm. The copper foil coated with PSPIC-1 and prebaked as described above was exposed with an unfiltered mercury arc lamp (its wavelength measured was between 250 nm and 400 nm) and a power of 1000 mJ/cm². 3 wt % TMAH ethanol solution as the developing solution was used to develop the exposed film at 35° C. with ultrasonication. The development cannot succeed, i.e. the pattern cannot be developed clearly, after a developing time of 200 seconds and longer.

COMPARATIVE EXAMPLE 2

To 80 g of the PI-1 solution prepared in Example 1, 3.2 g of pentaerythritol triacrylate, and 1.6 g of photoinitiator, bis(2,4,6-trimethylbenzoyl)-phenylphosphineoxide, were added and well mix to obtain a photosensitizing polyimide PSPIC-2. The PSPIC-2 was evenly coated on an 1 OZ copper foil by a blade, prebaked for 5 minutes in a circulator oven at 120° C. to form a photosensitizing polyimide film having a thickness of about 20 µm. The copper foil coated with PSPIC-2 and prebaked as described above was exposed with an unfiltered mercury arc lamp (its wavelength measured was between 250 nm and 400 nm) and a power of 1000 mJ/cm². 3 wt % TMAH ethanol solution as the developing solution was used to develop the exposed film at 35° C. with ultrasonication. The development cannot succeed, i.e. the pattern cannot be developed clearly, after a developing time of 200 seconds and longer.

COMPARATIVE EXAMPLE 3

To 80 g of the unmodified PI solution V-1 prepared in Example 1, 3.2 g of pentaerythritol triacrylate, 2.63 g of N-[3-(dimethylamino)propyl]methacrylamide (monomer having a tertiary amino group) and 1.6 g of photoinitiator, bis(2,4,6-trimethylbenzoyl)-phenylphosphineoxide, were added and well mix to obtain a photosensitizing polyimide PSPIC-3. The PSPIC-3 was evenly coated on an 1 OZ copper foil by a blade, prebaked for 5 minutes in a circulator oven at 120° C. to form a photosensitizing polyimide film having a thickness of about 20 µm. The copper foil coated with PSPIC-3 and prebaked as described above was exposed with an unfiltered mercury arc lamp (its wavelength measured was between 250 nm and 400 nm) and a power of 1000 mJ/cm². 3 wt % TMAH ethanol solution as the developing solution was used to develop the exposed film at 35° C. with ultrasonication for a developing time of 90 seconds, followed by washing with ethanol for 30 seconds, and drying with air dryer prior to a post-curing procedure in a circulator oven at 230° C. for 30 minutes. A polyimide pattern having a thickness of 10 µm was obtained. The pattern, which has been through the developing and post-curing procedures, has a residual film thickness of 50%. The pattern has a resolution of 30 µm in line width and line-span when it was observed via an optical microscopy.

Table 1 lists the results from Examples 1 to Comparative Example 3.

TABLE 1

|  | Ex. 1 and 3 | Ex. 2 | Comp. Ex. 1 | Comp. Ex. 2 | Comp. Ex. 3 |
| --- | --- | --- | --- | --- | --- |
| Mole ratio between GMA/—COOH in unmodified PI | 0.5 | 0.25 | 1 | 0.5 | 0 |
| Mole ratio between tertiary amino group/—COOH in unmodified PI | 0.5 | 0.75 | 0 | 0 | 1 |
| Developing time (seconds) | 120 | 90 | >200 | >200 | <90 |
| Residual film Thickness (%) | 90 | 85 | Cannot develop | Cannot develop | 50 |

Table 2 lists the properties of the polyimide pattern prepared in Example 1.

TABLE 2

| Properties | Results | Testing methods |
| --- | --- | --- |
| Tensile strength | 10 kgf/mm² | ASTM D882 |
| Elongation | 4.9% | ASTM D882 |
| Resolution | <30 µm | Electron Microscope |
| Flexibility (MIT, R = 0.8) | 485, 631, 670 | IPC-TM-650(2.4.3) |
| Adhesiveness | 5 lb/in | 180°, rough side (F2-WS) |
| Thickness | 20 µm | |
| 5% weight loss/Tg | 319.6° C./224.6° C. | TGA/TMA |
| Coefficient of thermal xpansion (ppm, 30-200° C.) | 68.6 | |
| DK/Df | 3.7/0.023 | |
| Anti-soldering test (300° C. * 10 sec) | passed | |

What is claimed is:

1. A negative photoresist composition comprising the following components dissolved in a solvent: a) a polyimide having the following chemical structure (I); b) an unsaturated vinyl monomer that contains a tertiary amino group; and c) a photoinitiator, wherein an amount of the photoinitiator c) is 0.1-30% based on the weigh of the solid content of the polyimide (I), an amount of the monomer b) is 70-130% of moles of carboxyl group contained in the polyimide (I),

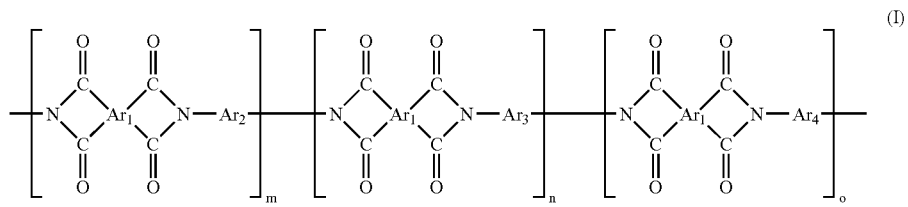

wherein
Ar$_1$ is a tetra-valent radical;
Ar$_2$ is a bivalent radical;
Ar$_3$ is a bivalent radical that contains a carboxyl group;
Ar$_4$ is a bivalent radical that contains —CH$_2$—C(OH)H—CH$_2$—O—C(O)—C(R)=CH;
in which R is H or a methyl group;
m+n+o=1, 0.1≦n+o≦0.6, and n:o=9:1~4:6.

2. The composition of claim 1, wherein n:o=3:1~1:1.

3. The composition of claim 2, wherein m=0.3~0.7.

4. The composition of claim 3, wherein the amount of the monomer b) is 90-110% of the moles of the carboxyl group contained in the polyimide (I).

5. The composition of claim 1, wherein Ar$_3$ is:

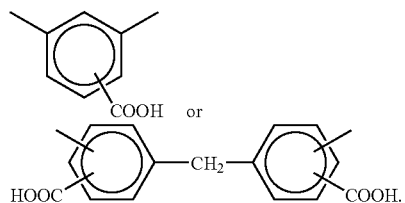

6. The composition of claim 1, wherein Ar$_4$ is:

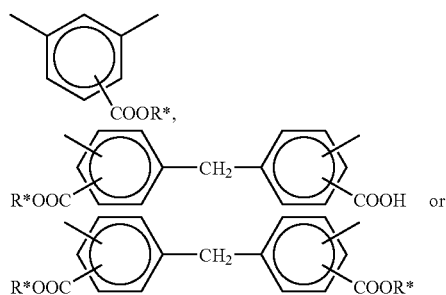

wherein R* is —CH$_2$—C(OH)H—CH$_2$—O—C(O)—C(R)=CH, in which R is H or a methyl group.

7. The composition of claim 1, wherein the monomer is tertiary amino C1-C4 alkyl acrylate or methacrylate, or N-(tertiary amino C1-C4 alkyl)acrylamide or methacrylamide.

8. The composition of claim 7, wherein the monomer is:

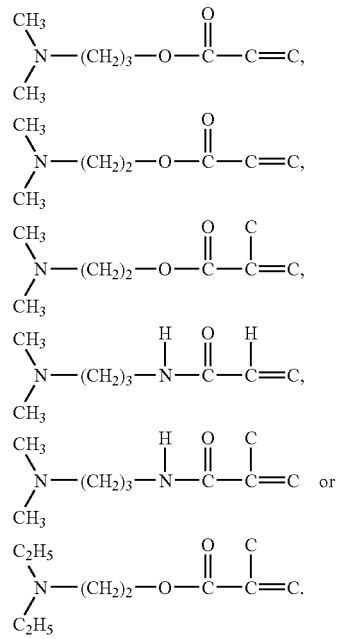

9. The composition of claim 1, wherein the solvent is N-methyl-2-pyrrolidone, N,N-dimethylacetamide, γ-butyrolactone, xylene, or toluene.

10. The composition of claim 1, wherein the photoinitiator is bis(2,4,6-trimethylbenzoyl)-phenylphosphineoxide, 2-benzyl-2-dimethylamino-1-1(4-morpholinophenyl)-butanone, 2,4,6-trimethyl benzoyl)diphenyl phosphine oxide, bis(.eta.5-2,4-cyclopentadien-1-yl)-bis(2,6-dufluoro-3-(1H-pyrrol-1-yl)-phen yl titanium, 4,4'-bis(dimethylamino)benzophenone, 4,4'-bis(diethylamino)benzophenone, or N-phenyldiethanolamine.

* * * * *